United States Patent [19]
Fukuda et al.

[11] Patent Number: 4,749,588
[45] Date of Patent: Jun. 7, 1988

[54] PROCESS FOR PRODUCING HYDROGENATED AMORPHOUS SILICON THIN FILM AND A SOLAR CELL

[76] Inventors: Nobuhiro Fukuda, 2881, Iijima-cho, Totsuka-ku, Yokohama-shi, Kanagawa 244; Yutaka Ohashi, 5-45, Dai 4-chome, Kamakura-shi, Kanagawa 247; Kenji Miyaji, 2070, Iijima-cho, Totsuka-ku, Yokohama-shi, Kanagawa 244, all of Japan

[21] Appl. No.: 834,414

[22] Filed: Feb. 28, 1986

Related U.S. Application Data

[63] Continuation of Ser. No. 653,246, Sep. 7, 1984, abandoned.

[51] Int. Cl.⁴ .............................................. B05D 3/06
[52] U.S. Cl. ...................................... 427/39; 427/74; 427/294; 427/402
[58] Field of Search ................... 427/39, 74, 294, 402

[56] References Cited
U.S. PATENT DOCUMENTS 4,379,181  4/1983  Cannella et al. ...................... 427/39
4,438,723  3/1984  Cannella et al. .................... 118/718
4,560,634 12/1985  Matsuo ............................ 427/39 X

OTHER PUBLICATIONS

The Journal of Non-Crystalline Solids, 32 (1979), 393-403.

Primary Examiner—Bernard D. Pianalto
Attorney, Agent, or Firm—Fisher, Christen & Sabol

[57] ABSTRACT

The speed of forming a film of a hydrogenated amorphous silicon (a-Si:H) can be increased by controlling the amount of a supplied energy in relation to the film-forming speed. Application of this technique to the production of a solar cell enables a hydrogenated amorphous silicon solar cell (a-Si:H cell) having a high photoelectric conversion efficiency to be produced at high speeds. The aforesaid controlling procedure comprises adjusting the amount (KJ/g-$Si_2H_6$) of an energy to be supplied to a film-forming speed depends mainly upon the flow rate of the gas and is not substantially affected by the amount of the energy.

21 Claims, No Drawings

PROCESS FOR PRODUCING HYDROGENATED AMORPHOUS SILICON THIN FILM AND A SOLAR CELL

This is a continuation application of U.S. patent application No. 653,246, filed Sept. 7, 1984, now abandoned.

TECHNICAL FIELD

This invention relates to a process for making an amorphous thin film, particularly a hydrogenated amorphous silicon (to be abbreviated as a-Si:H hereinafter) thin film having good electrical properties, at high speeds.

This invention also relates to a process for producing an amorphous silicon solar cell, particularly a hydrogenated amorphous silicon solar cell (to be abbreviated as a-Si:H cell hereinafter) having a high efficiency, at high speeds.

BACKGROUND ART

The a-Si:H thin film has been well studied in recent years, and its use in not only a solar cell and a photosensitive drum but also a scanning circuit of an image reading device, a driving circuit for image display devices, etc. has been considered.

The a-Si:H thin film is usually produced by glow discharge, sputtering, CVD (chemical vapor deposition), photo CVD (photoinduced chemical vapor deposition), etc., but with these methods, the speed of forming the thin film was as slow as several Å/sec or below. To increase the film-forming speed, the vapor deposition and ion plating techniques have also been studied. But with these methods, the quality of the resulting film which relates to photoelectrical properties becomes poor and the film cannot be used as such in the above-mentioned devices. Accordingly, at present, the film-forming speed is sacrificed, and by the glow discharge of $SiH_4$, an a-Si:H thin film is prepared at a speed of not more than 5 Å/sec.

A method of improving photoelectrical properties by increasing the RF power is disclosed in the specification of Japanese Laid-Open Patent Publication No. 186319/1982. This method is to form a thin film of polycrystalline silicon, and the electric power required for crystallization far exceeds the energy level employed in the present invention and should be 800 $KJ/g\text{-}SiH_4$ at the lowest. Accordingly, this method is disadvantageous in respect of energy, and for crystallization, the speed of forming the thin film must be maintained low. Hence, an increase in the film-forming speed cannot possibly be achieved.

One known application of the a-Si:H thin film is in an a-Si:H cell. The a-Si:H cell has recently been studied everywhere, and an advance has been noted in the efficiency achieved. However, in order to increase the efficiency in the prior art, the speed of forming the amorphous silicon active layer must be maintained at as low as not more than 5 Å. If the film-forming speed is increased in the formation of the a-Si:H cell from $SiH_4$, the efficiency of photoelectric conversion will be extremely reduced and reach only 1 to 2% at the highest.

The present inventors previously found that the aforesaid photoelectric conversion efficiency can be increased when an active thin film layer of amorphous silicon is formed by using $Si_NH_{2n+2}$ (n=2 or 3) instead of $SiH_4$ as a gas capable of forming a thin silicon layer in the production of a hydrogenated amorphous silicon solar cell composed of a substrate having a first electrode and, formed thereon in the order to be mentioned, an amorphous silicon thin film layer of a first type electrical conductor, an essentially intrinsic amorphous silicon thin film layer, an amorphous silicon thin film layer of a second type electrical conductor and a second electrode (Japanese Patent Application No. 4978/1982). According to this method, the speed of forming the amorphous silicon thin film layer is in the range of 5–10 Å/sec., and the efficiency decreases if the film forming speed is increased.

In the prior techniques described above, if an a-Si:H cell is formed by increasing the speed of forming at least the amorphous silicon thin film layer to 6 Å/sec or more, especially to 15 Å/sec or more, the photoelectric conversion efficiency of the cell is decreased to 2% or less, and the cell loses its utilitarian value.

The present inventors have made extensive investigations in order to solve the aforesaid problems of the prior methods, and have found that the speed of forming the a-Si:H film can be increased by controlling the amount of the supplied energy in relation to the speed of forming the thin film, and that when this technique is applied to the production of a solar cell, the solar cell can be produced at a high speed while maintaining a high photoelectric conversion efficiency. This discovery has led to the present invention.

DISCLOSURE OF THE INVENTION

Figure 1:
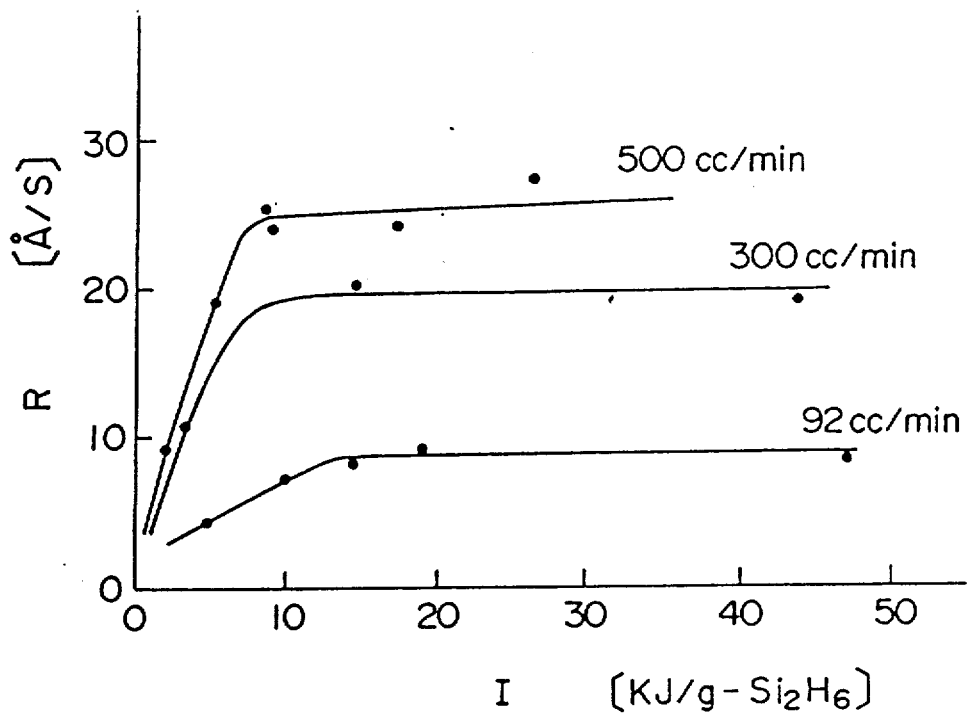
FIG. 1 is a graph showing the relation between the supplied energy I and the speed R of forming hydrogenated amorphous silicon thin film (a-Si:H) in the process of this invention.

According to this invention, there is provided a process for producing a thin film of hydrogenated amorphous silicon which comprises decomposing a film-forming gas composed mainly of disilane by glow discharge while it is flowing, and thereby forming a thin film of hydrogenated amorphous silicon on a substrate, wherein the amount of energy for decomposition to be applied per unit weight of the gas is adjusted to such an amount that the speed of forming the thin film depends mainly upon the flow rate of the gas and is not substantially affected by the amount of the energy, and wherein the speed of forming the thin film is increased to prevent crystallization of the thin film.

The invention also provides a process for producing a solar cell, which comprises decomposing a film-forming gas composed mainly of disilane while it is flowing, and successively forming an amorphous silicon thin film layer of a first type electrical conductor, an essentially intrinsic amorphous silicon thin film layer, an amorphous silicon thin film layer of a second type electrical conductor and a second electrode in this order on a substrate having a first electrode, wherein at least the essentially intrinsic amorphous silicon thin film layer is composed of a thin film of hydrogenated amorphous silicon which is formed by adjusting the amount of energy for decomposition to be applied per unit weight of the gas to such an amount that the speed of forming the thin film depends mainly upon the flow rate of the gas and is not substantially affected by the amount of the energy, and increasing the speed of forming the thin film to prevent crystallization of the thin film.

In the present invention, disilane is used as the film-forming material instead of the monosilane used in the prior art. The film-forming gas composed mainly of disilane is a gas composed of, as a main component, $Si_2H_6$ which corresponds to the general formula $Si_nH_{2n+2}$ in which n is 2. Preferably, the disilane has a high purity. But it can contain trisilane, tetrasilane, etc. (n in the general formula is 3, 4, etc.) which behave in the same way as the disilane during glow discharge. Usually, the gas has a disilane content of at least 70%, preferably at least 80%, more preferably at least 90%, most preferably at least 98%. The disilane is produced by a physical synthesizing method, for example a method comprising subjecting monosilane (n is 1 in the general formula) to silent discharge to change it partly to disilane and separating it, or by a chemical method comprising reducing hexachlorodisilane. For the purpose of industrially producing solar cells, the chemically synthesized disilane can be conveniently used because it can be obtained in stable quality and in large amounts.

In one preferred embodiment of the present invention, a thin film is formed by using a diluting gas. He, Ar and $H_2$ are preferred as the diluting gas. When the diluting gas is used, the reproducibility of photoelectrical properties is enhanced. Probably, such a diluting gas reduces the effect of trace impurities, and plays a role of alleviating the damage of the film by plasma. The ratio of dilution is not particularly limited, but usually, th aforesaid effect is exhibited when the concentration of disilane is 5 to 20% by volume.

When a thin film of amorphous silicon is to be formed on a substrate by decomposing the gas composed mainly of the disilane mentioned above by glow discharge while it is flowing, the amount of energy for decomposition to be applied to the gas is adjusted to such an amount that the speed of forming the thin film depends mainly upon the flow rate of the gas, and is not substantially affected by the amount of energy. Usually, the speed of forming the thin film can vary depending upon various factors such as the shape of the discharge device, the structure of the electrodes, the distance between the electrodes, the temperature of formation, the pressure of formation, and the manner of flowing of the gas. Particularly, by varying the flow rate of disilane (the amount of disilane fed) and the glow discharge energy, the film forming speed correspondingly varies greatly. It is usually difficult to control the film forming speed within an optimal range effectively by correlating the aforementioned factors.

The present inventors turned their attention to the glow discharge energy I per unit weight of the disilane fed $[KJ/g\text{-}Si_2H_6]$, and found that by using this factor as a parameter, the speed of forming the thin film can be correlated univocally with the flow rate of disilane (the amount of disilane fed). In addition, they have found the important fact that when the aforesaid factor is above a certain value, the speed of forming the thin film is scarcely affected by the glow discharge energy, and varies mainly depending upon only the flow rate of disilane.

FIG. 1 shows three examples with varying flow rates of disilane. For each flow rate, I $[KJ/g\text{-}Si_2H_6]$ corresponding to that portion which is to the right of the point where the curve changes to a horizontal one is the amount of discharge energy to be employed in the process of this invention. For example, when the flow rate is 500 cc/min., a discharge energy of at least about 6 $KJ/g\text{-}Si_2H_6$ is applied as seen from FIG. 1. It will be appreciated that in the area in which I is less than 6 $KJ/g\text{-}Si_2H_6$, the speed of forming the thin film depends upon both the flow rate of the film-forming gas and the amount of the glow discharge energy, but when I is 6 $KJ/g\text{-}Si_2H_6$ or more, the speed of forming the thin film scarcely depends upon the glow discharge energy, but is determined univocally by the flow rate of the film-forming gas.

The curves in FIG. 1 are obtained by a capacitively coupling-type RF glow discharge device having parallel flat plate electrodes. Those skilled in the art would easily understand that the same curve can be obtained by another device, for example an inductively coupling-type discharge device.

Generally, photosensitivity ($\sigma ph/\sigma D$) is used as an index for evaluating photoelectrical properties. For example, in a solar cell, the photoelectrical conversion efficiency is improved as the $\sigma ph/\sigma D$ value increases, and it is considered preferable that at least $\sigma ph/\sigma D \geq 10^4$. As will be shown by Examples to be given hereinbelow, thin films having a $\sigma ph/\sigma D$ of more than $10^4$ can be easily obtained by the present invention.

The upper limit of the preferred amount of energy applied in this invention is one at which no crystallization takes place. The upper limit is not univocally determined, but is greatly affected by the aforesaid speed of forming the thin film. In other words, if the film forming speed is increased, the energy that can be applied becomes higher. However, if the film forming speed is excessively large, the resulting thin film is damaged by the plasma. Consequently, the film is roughened and in an extreme case, the element becomes short-circuited. Thus, the photoelectric conversion efficiency is reduced and the resulting film loses its utilitarian value. Such an element can become practical only when its properties are improved by annealing such as hydrogen annealing. According to the experiments conducted by the present inventors, when the amount of energy is up to 300 $KJ/g\text{-}Si_2H_6$ at a film forming speed of 10 Å/sec, the film exists in the amorphous state without crystallization, as determined by electron beam diffraction. However, the preferred amount of energy is 6 to 100 KJ, especially preferably 10 to 100 KJ, per gram of $Si_2H_6$.

To prevent crystallization of the thin film in the process of this invention, a large thin film-forming speed is selected. Specifically, it is at least 6 Å/sec, preferably at least 10 Å/sec, more preferably at least 15 Å/sec. If the thin film-forming speed is less than 6 Å/sec, crystallization is liable to occur, and at 3 Å/sec or below, the occurrence of crystallization is frequent. If, however, the speed is adjusted to at least 6 Å/sec, the high supplied energy is consumed effectively for improving the photoelectrical properties without causing crystallization. For example, the film does not undergo crystallization even when an energy in an amount of 100 KJ per gram of disilane is applied.

To add, in the conventional glow discharge decomposition position of monosilane, it was thought that the power consumption should be lower in order to avoid damages of the film by the plasma. On the other hand, in the present invention in which disilane is used, the photoelectrical properties of the film cannot be improved unless the energy including the power consumption is increased. This shows that the disilane cannot be put in the same category as the monosilane.

According to the process of this invention, the photoelectrical properties can be further improved by increasing the pressure to a range of 1 to 10 torr during the formation of the a-Si:H film, although no detailed reason has been able to be assigned to it. Furthermore, when the a-Si:H thin film so prepared is applied to an a-Si:H cell, the photoelectric conversion efficiency can be further improved. To increase the pressure, it may be possible to employ a method in which the conductance to the vacuum system is reduced without changing the flow rate of the gas. Preferably, however, there is used a method which comprises increasing the flow rate of the thin film-forming gas. When the flow rate is increased, the aforesaid effect ascribable to the rise in pressure is produced and the effect of trace impurities which give rise to a problem in the prior art is reduced. Thus, the photoelectrical properties are improved and their reproducibility increases.

In the process of this invention, the temperature is maintained at 200° to 450° C., preferably 250° to 400° C., during the formation of the a-Si:H thin film on the substrate. An especially preferred combination of conditions is a combination of a lower temperature within the above temperature range with a large amount of supplied energy.

The especially preferred temperature range used when the a-Si:H film is applied to an a-Si:H cell varies depending upon the structure of the a-Si:H cell. In other words, if the temperature is increased too much, the electrode formed on the substrate may be damaged to reduce the efficiency. Hence, the temperature should be adjusted to a suitable value. This temperature condition also varies depending upon the magnitude of the supplied energy. Preferably, when the energy to be applied is high, the temperature is maintained relatively low, and when the energy is low, the temperature is maintained high.

According to a preferred embodiment of the process of this invention, a substrate on which to form the a-Si:H thin film, such as a glass plate, a stainless steel plate or a ceramic plate, is set in a reaction chamber in which glow discharge is possible. A film-forming gas composed mainly of disilane is continuously introduced into the reaction chamber, and glow discharge is performed while adjusting the pressure of the inside of the reaction chamber at 1 to 10 torr. During the film formation, the temperature inside the reaction chamber is maintained at 200° to 450° C., and the flow rate of the gas is adjusted so that the film-forming speed is maintained at 6 Å/sec. or higher at which the crystallization of the thin film can be prevented. Also, the amount of the energy to be applied to the gas is adjusted to such an amount that the film-forming speed depends mainly upon the flow rate of the gas and is not substantially affected by the amount of the energy.

The supplied energy I which is defined as energy applied to the gas per unit weight of the disilane is calculated, for example, in accordance with the following equation.

$$I = \frac{\text{(Power to be applied)}}{\text{(Flow rate} \times \text{(Average molecular weight of the gas/22.4)}} \times \text{(Weight fraction of Si}_2\text{H}_6 \text{ in the gas)}$$

For example, when a power of 20W is to be applied to 100 cc/min. of disilane (concentration 10% by volume) diluted with He, the supplied energy I is calculated in the following manner.

Average molecular weight = (62.2184 × 0.1 + 4.0026 × 0.9) = 9.824 (g)

Weight fraction of Si$_2$H$_6$ = $\frac{62.2184 \times 0.1}{9.824}$ = 0.633

Figure 2:
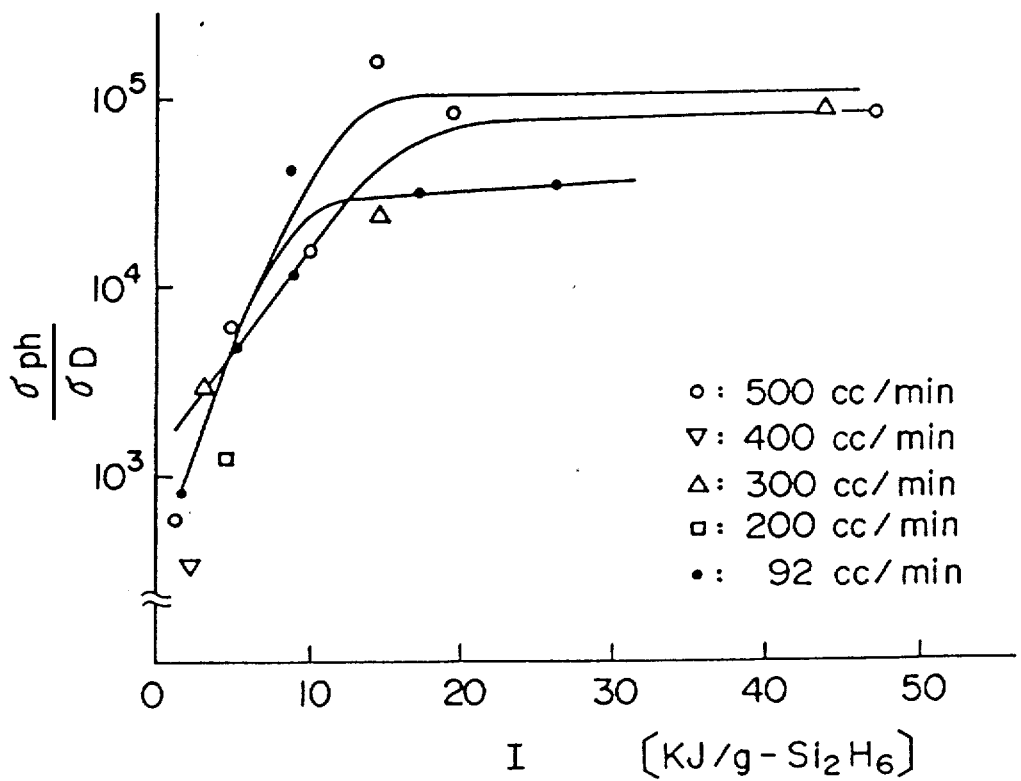
FIG. 2 is a graph showing the relation between the supplied energy I and the photosensitivity of the a-Si:H.

Therefore, $I = \frac{20}{\frac{0.1}{60} \times \frac{9.824}{22.4}} \times 0.633 = 17.3 \, [KJ/g\text{-Si}_2\text{H}_6]$ The I values on the abscissas of FIGS. 1 and 2 were calculated as shown above.

As another embodiment, it is possible in this invention to introduce a heated substrate into the reaction chamber in which glow discharge is performed, and thereby to form a thin film of a-Si:H on the substrate.

According to still another embodiment, an n- or p-type conductive a-Si:H thin film can be produced by using an ordinary dopant such as PH$_3$, AsH$_3$ and B$_2$H$_6$.

The process for producing the a-Si:H thin film in accordance with this invention can be advantageously applied to the production of an a-Si:H cell. Its preferred embodiment is described below.

A substrate having a first electrode is set in a reaction chamber in which glow discharge is possible, and maintained at a temperature of 200° to 450° C. A gas of a first type conductor and a thin film-forming gas composed mainly of disilane are introduced into the reaction chamber, and by glow discharge, an a-Si:H layer of the first type conductor is formed. Then, only the thin film-forming gas is fed into the reaction chamber, and the amount of energy to be imparted by glow discharge is adjusted to such an amount that the speed of forming a hydrogenated essentially intrinsic amorphous silicon (i-a-Si:H) thin film layer depends mainly upon the flow rate of the thin film-forming gas and is not affected by the amount of the energy, for example to 6 KJ/g-Si$_2$H$_6$ or more to form the aforesaid thin film layer. Preferably, at this time, the flow rate of Si$_2$H$_6$ is increased, and the pressure is adjusted to 1 to 10 torr. Furthermore, the speed of forming the thin film layer is adjusted to at least 10 Å/sec, more preferably at least 20 Å/sec. During the formation of the i-a-Si:H thin film layer, a trace of B$_2$H$_6$ may be introduced without any deleterious effect by utilizing another invention of the present inventors (Japanese Patent Publication No. 122983/1982). Then, a gas of a second type conductor which is reverse to the first type conductor and the thin film-forming gas are introduced, and by glow discharge, an a-Si:H thin film layer of the second type conductor is formed (for example, if the first type conductor is the n-type, the second type conductor is the p-type). Finally, a second electrode is formed.

The amount of energy to be applied per unit weight of the thin film-forming gas can be calculated by the same method as described hereinabove with regard to the formation of the a-Si:H thin film.

According to another embodiment, the a-Si:H layer of the first type conductor (for example, the n-type), the i-a-Si:H layer and the a-Si:H layer of the second type conductor (for example, the p-type) may be respectively formed in separate chambers connected to each other.

Figure 5:
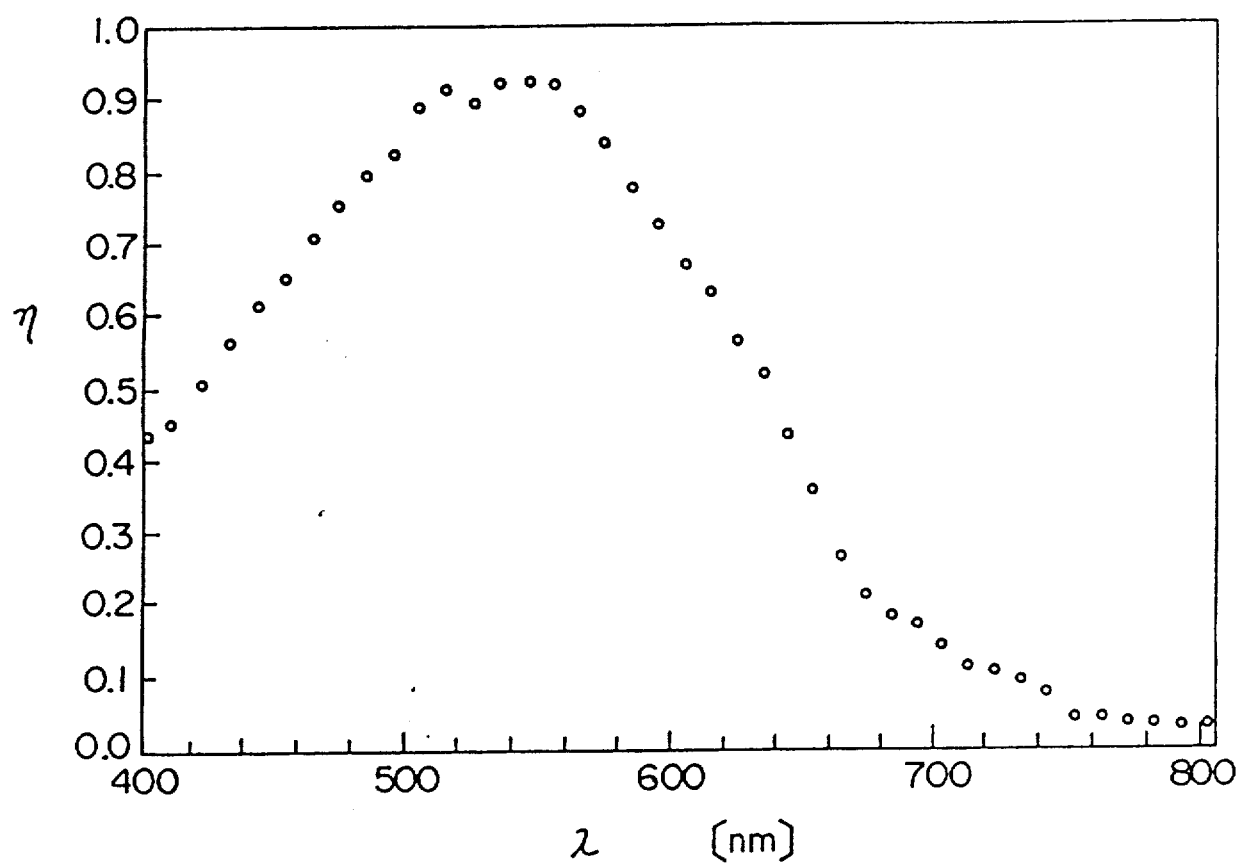
FIG. 5 is a graph showing one example of the light collecting efficiency of the a-Si:H cell in accordance with the process of this invention.

Surprisingly, in the resulting a-Si:H cell of this invention, the peak of the photon collecting efficiency coincides with the peak of the spectral intensity of solar energy as shown in FIG. 5. This is because the current value increases markedly and the efficiency is greatly improved.

The thickness of the a-Si:H film in the a-Si:H cell of this invention is usually 50 to 500 Å for the a-Si:H layers of the first and second type conductors, and 3000 to 7500 Å for the i-a-Si:H layer.

In the present invention, the speed of forming the i-a-Si:H layer which has a large thickness and requires the longest period of time for its formation is increased to about 10 times or more that in conventional cells. Consequently, the productivity of the a-Si:H cell unit naturally increases markedly in the present invention. It is sufficient that the time required for producing one a-Si:H cell unit is within 5 minutes. Thus the time is shortened to about one-tenth or below of that required for producing conventional a-Si:H cell unit.

The time for forming the a-Si:H layer in the silicon layers of the first and second type conductors is usually about 10 seconds to several tens of seconds. The silicon layers of the first and second type conductors have a thickness of as thin as 50 to 500 Å. The formation of these layers is terminated within 2 minutes even when it is formed by decomposing monosilane. Thus, the use of disilane as a starting material is not always necessary.

Dopant gases used in the prior art can be used for obtaining the a-Si:H film of the first or second type conductors. For example, $B_2H_6$ may be used for the p-type, and $PH_3$ and $AsH_3$, for the n-type. The proportion of the dopant gas is usually 0.1 to 5 parts by volume per 100 parts by volume of the thin film-forming gas composed mainly of disilane.

There is no particular restriction on the materials for the substrate or the materials for the first and second electrodes, and materials heretofore used may be effectively used in this invention. For example, the substrate may be insulating or conducting and transparent or non-transparent. Specifically, a film or a plate-like material formed of glass, alumina, silicon, stainless steel, aluminum, molybdenum and thermally stable polymers may be effectively used as the substrate. There is no restriction on the materials for the first and second electrodes except that a transparent or translucent material should be used for the electrode on the light incident side. Thin films or plates of aluminum, molybdenum, Nichrome, ITO, tin oxide, stainless steel, etc. can be effectively used as the electrode materials.

INDUSTRIAL APPLICABILITY

The a-Si:H thin film obtained by the process of this invention can be applied to various semiconductor devices, particularly conveniently in the light active region of an amorphous silicon solar cell (a-Si:H cell). Since the process of this invention can give the a-Si:H thin film at high speeds, a-Si:H cells having a high efficiency can be formed at a speed in excess of 15 Å/sec which has previously been considered impossible, and the productivity of a-Si:H cell production can be increased to as great as nearly 10 times.

BEST MODE OF PRACTICING THE INVENTION

The following Examples illustrate the present invention more specifically.

EXAMPLES 1 to 10

A substrate of glass (Corning 7059) was set in an RF capacitance coupling-type reaction device having parallel flat plate electrodes and equipped with a substrate heating means, a vacuum exhausting means and a gas introducing means, and heated to 300° C. while the reaction device was evacuated (to less than $10^{-7}$ torr) by an oil diffusion pump. The vacuum system was then switched to an oil rotary pump for exhaustion, and a thin film-forming gas composed of $Si_2H_6$ and He in a volume ratio of 10:90 was introduced into the reaction device through mass flow controllers, and the pressure of the reaction chamber was adjusted by vacuum valves.

The energy (power) to be applied was measured by a known power measuring method. Specifically, by a power meter inserted between a high-frequency power supply and the electrodes, the power of the incident wave and the power of the reflecting wave were read. The energy was calculated from the difference between the readings. The film thickness was measured by a surface roughness tester. The film-forming speed was calculated on the basis of the time (seconds) required for the formation of a film having a thickness of about 5000 Å. The dark electrical conductivity, $\sigma D$, was measured at room temperature. The photoconductivity $\sigma ph$ was measured by irradiating the light of AM1 (100 mW/cm$^2$) by a solar simulator. The photosensitivity used was a value obtained by dividing the photoconductivity $\sigma ph$ by the electrical conductivity (dark electrical conductivity $\sigma D$). The results obtained with varying flow rates of the film-forming gas and varying energies applied are summarized in Table 1 (a referential example is the case where the film-forming speed is less than 6 Å/sec; and a comparative example is the case where the supplied energy is less than 6 KJ/g-$Si_2H_6$).

It is seen from the results of Examples 1 to 10, Referential Examples 1 to 3 and Comparative Examples 1 to 6 indicated in Table 1 that when the supplied energy is less than 5.2 [KJ/g-$Si_2H_6$], $\sigma ph/\sigma D$ is less than $1 \times 10^4$, and the photoelectrical properties are poor. The data obtained in these Examples and Comparative Examples when the flow rate of the film-forming gas was 92 cc/min., 300 cc/min., and 500 cc/min. are shown in FIG. 1. In the case of the flow rate being 500 cc/min. in FIG. 1, the region where the supplied energy I is less than about 6 [KJ/g-$Si_2H_6$] is a region where the film-forming speed R rapidly increases as do the supplied energy I and the flow rate of the film-forming gas. In the region where the supplied energy I is at least about 6 [KJ/g-$Si_2H_6$], the film-forming speed R scarcely has to do with the supplied enregy I, and is determined mainly depending upon the flow rate of the film-forming gas.

FIG. 2 depicts the relation between the supplied energy I and the photosensitivity $\sigma ph/\sigma D$ on the basis of the data shown in Table 1. It is seen from FIG. 2 that the photoelectrical properties are markedly improved by applying the energy such that the film-forming speed is dominated mainly by the flow rate of the film-forming gas. This phenomenon differs from the phenomenon previously known to those skilled in the art, namely the fact that if the film-forming speed observed in the formation of an a-Si:H thin film from monosilane SiH4 is increased, the photoelectrical properties are deteriorated. The present Examples show that the photoelectrical properties are not deteriorated even when the a-Si:H thin film is formed at a speed exceeding 20 Å/sec. This shows that the process of this invention enables the production of a device by high-speed film formation which has previously been considered impossible.

heated to 300° C. while the device was evacuated to less than 10 torr by an oil diffusion pump. Then, helium-diluted 10% disilane was introduced at a flow rate of 90 to 500 cc/min., and glow discharge was carried out at a pressure of 1 to 5 torr while applying a power having a frequency of 13.56 MHz to form a thin film of hydrogenated silicon.

Figure 3:
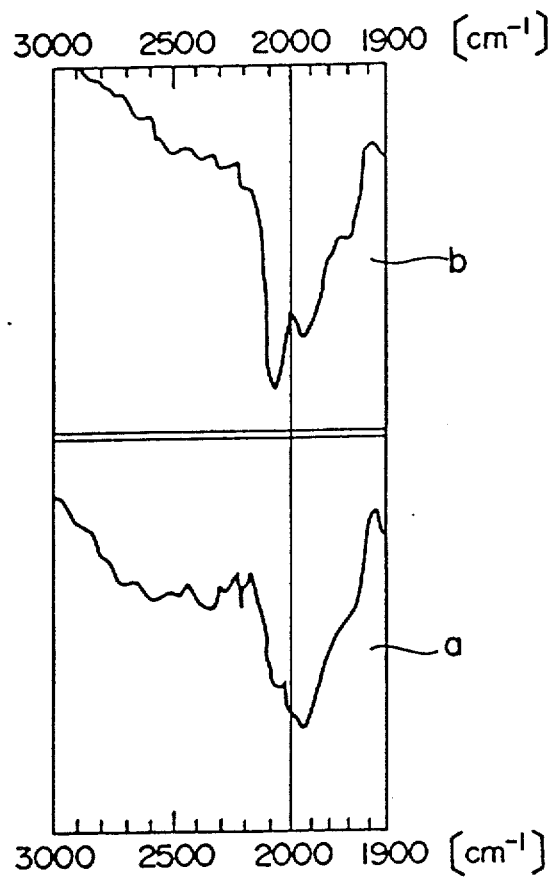
FIG. 3 is an infrared spectral chart of the a-Si:H.

The infrared spectral chart of the resulting thin film is shown in FIG. 3. In FIG. 3, a shows the results obtained at a power of 150 W, and b shows the results obtained at a power of 50 W. Since the flow rate of the gas was 150 cc/min., the supplied energies I were calculated as

TABLE 1

| No. | Flow rate [cc/min] | Pressure [torr] | Supplied energy I [KJ-g/Si$_2$H$_6$] | Film-forming speed [Å/sec] | $\sigma$D [S·cm$^{-1}$] | $\sigma$ph [S·cm$^{-1}$] | $\sigma$ph/$\sigma$D | Remarks |
|---|---|---|---|---|---|---|---|---|
| Example | | | | | | | | |
| 1 | 92 | 1 | 9.4 | 7.3 | 2.2 × 10$^{-9}$ | 3.4 × 10$^{-5}$ | 1.5 × 10$^4$ | |
| 2 | 92 | 1 | 14.1 | 8.1 | 3.4 × 10$^{-10}$ | 5.1 × 10$^{-5}$ | 1.5 × 10$^5$ | |
| 3 | 92 | 1 | 18.8 | 9.2 | 1.4 × 10$^{-9}$ | 1.1 × 10$^{-4}$ | 7.8 × 10$^4$ | |
| 4 | 92 | 1 | 47.0 | 8.2 | 1.5 × 10$^{-9}$ | 1.2 × 10$^{-4}$ | 8.0 × 10$^4$ | |
| 5 | 300 | 5 | 14.4 | 19.8 | 2.5 × 10$^{-10}$ | 5.6 × 10$^{-6}$ | 2.2 × 10$^4$ | |
| 6 | 300 | 2 | 43.3 | 18.3 | 1.7 × 10$^{-10}$ | 1.5 × 10$^{-5}$ | 8.8 × 10$^4$ | |
| 7 | 500 | 5 | 8.6 | 25.0 | 1.6 × 10$^{-10}$ | 1.8 × 10$^{-6}$ | 1.1 × 10$^4$ | |
| 8 | 500 | 5 | 17.3 | 24.0 | 6.7 × 10$^{-10}$ | 2.0 × 10$^{-5}$ | 3.0 × 10$^4$ | |
| 9 | 500 | 5 | 26.0 | 27.1 | 5.6 × 10$^{-9}$ | 1.9 × 10$^{-4}$ | 3.4 × 10$^4$ | |
| 10 | 500 | 5 | 8.6 | 24.0 | 1.5 × 10$^{-10}$ | 8.9 × 10$^{-6}$ | 4.7 × 10$^4$ | |
| Referential Example | | | | | | | | |
| 1 | 46 | 1 | 18.8 | 5.6 | 1.9 × 10$^{-9}$ | 8.4 × 10$^{-5}$ | 4.4 × 10$^4$ | $\sigma$ph/$\sigma$D<10$^4$ |
| 2 | 46 | 1 | 18.8 | 5.1 | 1.5 × 10$^{-9}$ | 8.7 × 10$^{-5}$ | 5.8 × 10$^4$ | but the film- |
| 3 | 92 | 5 | 9.4 | 4.2 | 2.8 × 10$^{-10}$ | 1.1 × 10$^{-5}$ | 3.9 × 10$^4$ | forming speed is <6Å/S |
| Comparative Example | | | | | | | | |
| 1 | 92 | 1 | 4.7 | 4.5 | 2.2 × 10$^{-9}$ | 1.4 × 10$^{-5}$ | 6.4 × 10$^3$ | |
| 2 | 200 | 1 | 4.3 | 8.6 | 2.2 × 10$^{-9}$ | 2.6 × 10$^{-6}$ | 1.2 × 10$^3$ | |
| 3 | 300 | 2 | 2.9 | 10.9 | 1.9 × 10$^{-9}$ | 5.3 × 10$^{-6}$ | 2.8 × 10$^3$ | |
| 4 | 400 | 5 | 2.2 | 7.2 | 3.1 × 10$^{-9}$ | 1.2 × 10$^{-6}$ | 3.9 × 10$^2$ | |
| 5 | 500 | 5 | 1.7 | 8.4 | 4.5 × 10$^{-10}$ | 3 × 10$^{-7}$ | 6.7 × 10$^2$ | |
| 6 | 500 | 5 | 5.2 | 18.9 | 1.6 × 10$^{-10}$ | 7 × 10$^{-7}$ | 4.4 × 10$^3$ | |

EXAMPLES 11 to 13

In the above examples, the temperature of the substrate was set at 250° and 385° C. The results are shown in Table 2.

The results of these examples show that if the supplied energy I is increased and the temperature of the substrate is properly selected, the $\sigma$ph/$\sigma$D value is further improved. The $\sigma$ph/$\sigma$D tended to be improved at a high supplied energy when the temperature of the substrate is low, and at a relatively low supplied energy when the temperature of the substrate is higher.

26 [KJ/g-Si$_2$H$_6$] and 8.6 [KJ/g-Si$_2$H$_6$], respectively.

In FIG. 3, the absorption at 1960-2000 cm$^{-1}$ corresponds to SiH, and the absorption at 2060-2100 cm$^{-1}$, to SiH$_2$. In FIG. 3, a refers to the case where a sufficiently high energy specified in this invention was applied, and b, to the case where a lower energy was applied. It is seen from it that when the sufficiently high energy is applied, the absorption at 1960-2000 cm$^{-1}$ corresponding to SiH becomes larger, and when the lower energy is applied, the absorption at 2060-2100 cm$^{-1}$ corresponding to SiH$_2$ becomes larger.

The corresponding photoconductivity is 3.4×10$^{-5}$

TABLE 2

| Example No. | Flow rate [cc/min] | Pressure [torr] | Supplied energy I [KJ-g/Si$_2$H$_6$] | Film-forming speed [Å/sec] | $\sigma$D [S·cm$^{-1}$] | $\sigma$ph [S·cm$^{-1}$] | $\sigma$ph/$\sigma$D | Temperature of the substrate prescribed [°C.] |
|---|---|---|---|---|---|---|---|---|
| 11 | 500 | 5 | 26.0 | 33.5 | 6.0 × 10$^{-10}$ | 1.5 × 10$^{-4}$ | 2.5 × 10$^5$ | 250 |
| 12 | 92 | 1 | 9.4 | 6.9 | 5.2 × 10$^{-10}$ | 6.6 × 10$^{-5}$ | 1.3 × 10$^5$ | 385 |
| 13 | 500 | 5 | 26.0 | 31.7 | 1.1 × 10$^{-10}$ | 2.1 × 10$^{-5}$ | 1.9 × 10$^4$ | 385 |

EXAMPLE 14

A silicon wafer having a specific resistance of at least 3000 ohms-cm and a substrate of glass (Corning 7059) were set in an RF capacitance coupling-type glow discharge device having parallel flat plate electrodes and equipped with a substrate heating means, a vacuum exhausting means and a gas introducing means, and (S.cm$^{-1}$) for a, and 1.8×10$^{-6}$ (S.cm$^{-1}$) for b, and the value for a is about 19 times as good as the value for b. The photosensitivity ($\sigma$pH/$\sigma$D) is 2.5×10$^5$ for a, and 1.1×10$^4$ for b, and the value for a is about 23 times as good as the value for b. The ratios of improvement of the photoconductivity and the photosensitivity which are 19–23 times agree well with each other. This is presumably because the photoelectrical properties have been improved by increasing the supplied energy.

It has previously been known that to maintain good photoelectrical properties, the form of hydrogen-silicon bonding in the thin film of hydrogenated silicon is preferably SiH rather than SiH$_2$. It is evident from the above examples that in the hydrogenated silicon thin film (a-Si:H) formed by the present invention, the number of SiH bonds existing is more than that of SiH$_2$ bonds.

EXAMPLE 15

There was used an RF capacitance coupling-type reaction chamber having parallel flat plate electrodes and equipped with a substrate heating means and a preliminary vacuum chamber. A starting gas composed of B$_2$H$_6$, Si$_2$H$_6$ and He in a volume ratio of 0.11:10:90 was introduced from a starting gas introducing device at a flow rate of 40 cc/min. By adjusting the amount of exhaustion by a vacuum exhausting system, the pressure of the inside of the reaction chamber was maintained at 2 torr. In the meantime, a glass plate having deposited thereon an ITO film and an SnO$_2$ film was inserted as a first electrode into the preliminary vacuum chamber, and heated to 300° C. in a He atmosphere and the pressure was reduced to 2 torr. The substrate was transferred from the preliminary chamber to the reaction chamber, and glow discharge was carried out at 13.56 MHz and 10 W to form a p-type a-Si:H layer on the first electrode plate for 30 seconds.

Then, a starting gas composed of Si$_2$H$_6$ and He in a volume ratio of 10:90 was used and introduced at a flow rate of 500 cc/min. The pressure of the inside of the reaction chamber was set at 5 torr, and glow discharge was started. The discharge power was set at 150 W, and the supplied energy I to be given to Si$_2$H$_6$ was set at the following value calculated by the formula given hereinabove.

$$\frac{150}{\frac{0.5}{60} \times \frac{9.824}{224}} \times 0.633 = 26.0 \ [KJ/g\text{-}Si_2H_6]$$

This I value is included within the region in FIG. 1 in which the film-forming speed depends only upon the flow rate. The speed of forming the essentially intrinsic amorphous silicon layer was 33 Å/sec, and the time required for its formation was 1 minute 45 seconds.

An n-type a-Si:H layer was deposited on the resulting essentially intrinsic amorphous silicon layer by using a starting gas composed of PH$_3$/Si$_2$H$_6$/He in a volume ratio of 0.2:10:90. The time required for forming the n-type layer was 40 seconds. The pressure was 2 torr; the power of glow discharge was 10 W; and the flow rate of the starting gas was 40 cc/min.

The supplied energy I during the formation of the p-type a-Si:H and n-type a-Si:H was 21.6 [KJ/g-Si$_2$H$_6$] calculated in the same way as above.

ITO was vapor-deposited on the resulting n-type a-Si:H film by electron beam vapor deposition to use it as a second electrode. Thus, an a-Si:H cell was obtained.

The light of AMI was irradiated on the a-Si:H cell from the n side by means of a solar simulator, and its properties were examined. The properties of the cell under irradiation of light of AMI (100 mW/cm$^2$) with a cell area of 0.037 [cm$^2$] were excellent as shown by a photoelectric conversion efficiency of 5.03%, an open circuit voltage of 0.77V, a short-circuit current of 11.4 mA/cm$^2$ and a fill factor of 0.570.

EXAMPLE 16

Example 15 was repeated except that the energy for forming the essentially intrinsic amorphous silicon layer was decreased. The supplied energy I was 8.6 [KJ/gSi$_2$H$_6$], and the speed of forming this layer was 21 Å/sec, and a period of 2 minutes was required for its formation. The resulting a-Si:H cell was excellent as demonstrated by its photoelectric conversion efficiency of 4.0%.

COMPARATIVE EXAMPLE 7

A cell was formed in the same way as in Example 15. The energy value was changed to 5.2 [KJ/g-Si$_2$H$_6$], however. The time required for formation was 2 minutes 15 seconds. The speed of forming the essentially intrinsic amorphous silicon layer was as high as about 19 Å/sec, but the photoelectric conversion efficiency of the cell was as poor as less than 1%.

It is evident from a comparison of this Comparative Example with Examples 15 and 16 that the magnitude of the supplied energy I during the formation of the essentially intrinsic amorphous silicon layer greatly affects the photoelectric conversion efficiency of the a-Si:H cell, and that the lower limit of the supplied energy I exists at about 6 [KJ/g-Si$_2$H$_6$].

EXAMPLE 17

In Example 15, an a-Si:H cell was produced by using an electrolytically polished stainless steel substrate instead of forming the transparent electrode on the glass substrate. The i-v curve and the light collecting efficiency obtained with this a-Si:H cell under irradiation of light of AMI were as shown in FIGS. 4 and 5, respectively.

Figure 4:
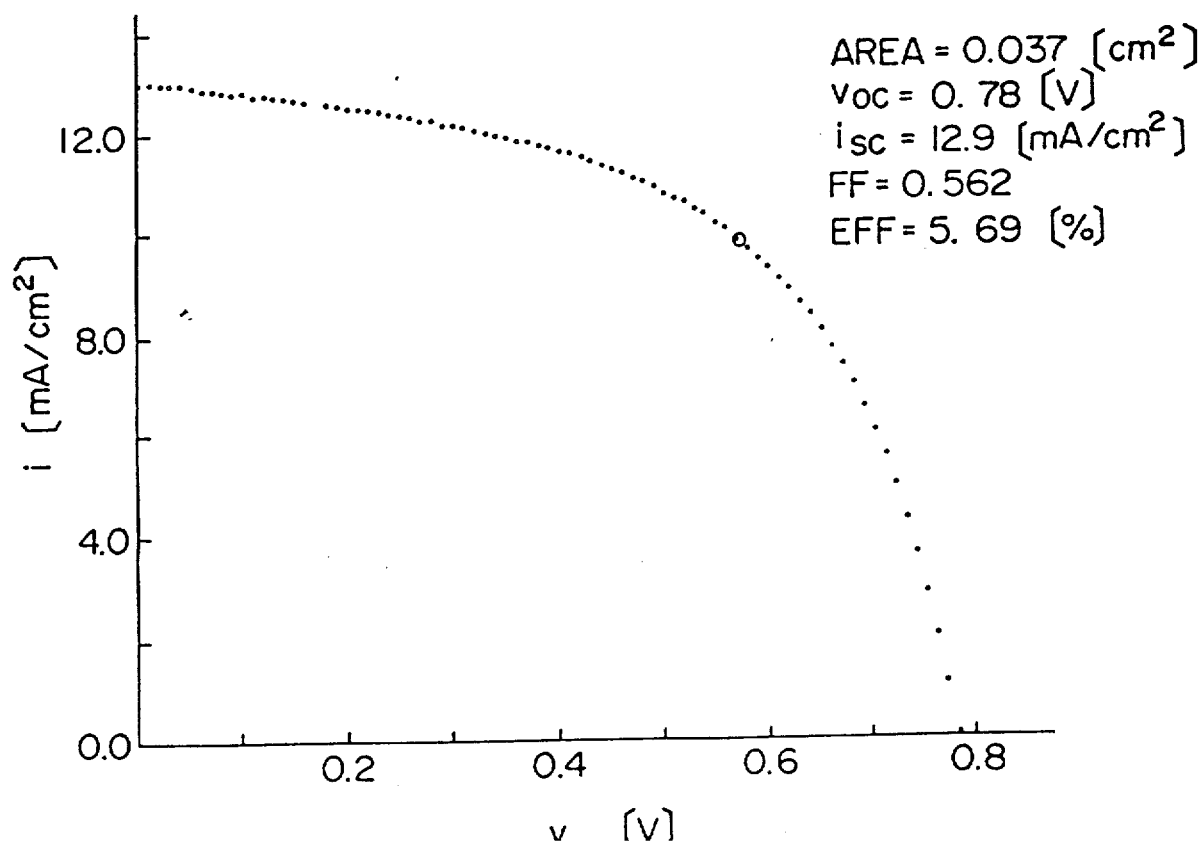
FIG. 4 is a graph showing one example of the i-v curve of an a-Si:H cell in accordance with the process of this invention.

In FIG. 4, voc represents an open circuit voltage; isc, a short-circuit current; FF, a fill factor; and EFF, a photoelectric conversion efficiency. The fact that an efficiency of 5.69% was obtained at a film forming speed of 33 Å/sec shows that the present invention is much superior to the prior art.

In FIG. 5, the abscissa shows the wavelength $\lambda$ (nm) of the incident light falling through a constant energy spectrophotometer, and the ordinate, the collecting efficiency $\eta$ per number of incident photons. The peak value of the collecting efficiency here agrees well with the peak value in a solar light spectrum.

What is claimed is:

1. A process for producing a thin film of hydrogenated amorphous silicon which comprises decomposing a film-forming gas composed of disilane by glow discharge while said gas is flowing, and thereby forming a thin film of hydrogenated amorphous silicon on a substrate, wherein the amount of energy for decomposition to be applied per unit weight of the gas is adjusted to such an amount that the speed of forming the thin film depends mainly upon the flow rate of the gas and is not substantially affected by the amount of the energy, said supplied energy being at least 6 KJ per gram of said gas and wherein the speed of forming the thin film is increased to prevent crystallization of the thin film.

2. The process of claim 1 wherein the amount of the energy is adjusted to at least 6 KJ per gram of said gas, and the speed of forming the thin film is adjusted to at least 6 Å/sec.

3. The process of claim 1 wherein the amount of the energy is adjusted to at least 10 KJ per gram of said gas, and the speed of forming the thin film is adjusted to at least 10 Å/sec.

4. The process of claim 1 wherein the amount of the energy is adjusted to 10 to 100 KJ per gram of said gas, and the speed of forming the thin film is adjusted to at least 15 Å/sec.

5. The process of any one of claims 1 to 4 wherein the thin film is formed at a temperature of 200° to 450° C.

6. The process of any one of claims 1 to 4 wherein the thin film is formed under a pressure of 1 to 10 torr.

7. The process of any one of claims 1 to 4 wherein the film-forming gas is diluted with helium, argon or hydrogen.

8. The process of claim 7 wherein the film-forming gas is diluted to a concentration of 5 to 20% by volume.

9. A process for producing a solar cell, which comprises decomposing a film-forming gas composed of disilane while it is flowing, and successively forming an amorphous silicon thin film layer of a first type electrical conductor, an essentially intrinisic amorphous silicon thin film layer, an amorphous silicon thin film layer of a second type electrical conductor and a second electrode in this order on a substrate having a first electrode, wherein at least the essentially intrinsic amorphous silicon thin film layer is composed of a thin film of hydrogenated amorphous silicon which is formed by adjusting the amount of energy for decomposition to be applied per unit weight of the gas to such an amount that the speed of forming the thin film depends mainly upon the flow rate of the gas and is not substantially affected by the amount of the energy, said supplied energy being at least 6 KJ per gram of said gas and increasing the speed of forming the thin film to prevent cyrstallization of the thin film.

10. The process of claim 9 wherein the amount of the energy is adjusted to at least 6 KJ per gram of said gas, and the speed of forming the thin film is adjusted to at least 6 Å/sec.

11. The process of claim 9 wherein the amount of the energy is adjusted to at least 10 KJ per gram of said gas, and the speed of forming the thin film is adjsuted to at least 10 Å/sec.

12. The process of claim 9 wherein the amount of the energy is adjusted to 10 to 100 KJ per gram of said gas, and the speed of forming thin film is adjusted to at least 15 Å/sec.

13. The process of any one of claims 9 to 12 wherein the thin film is formed at a temperature of 200° to 450° C.

14. The process of any one of claims 9 to 12 wherein the thin film is formed under a pressure of 1 to 10 torr.

15. The process of any one of claims 9 to 12 wherein the film-forming gas is diluted with helium, argon or hydrogen.

16. The process of claim 15 wherein the film-forming gas is diluted to a concentration of 5 to 20% by volume.

17. A process for producing a thin film of hydrogenated amorphous silicon comprising:
   decomposing a film-forming, flowing gas of disilane by glow discharge whereby an amount of energy for said decomposing is adjusted to at least 6 KJ per gram of said gas;
   forming said thin film of hydrogenated amorphous silicon on a substrate, said film being formed at a speed adjusted to at least 6 Å/sec between a temperature of 200° to 450° C. and a pressure of 1 to 10 torr, said speed of forming said thin film being selectively increased to prevent crystallization of said thin film.

18. The process of claim 17 wherein the amount of the energy is adjusted to at least 10 KJ per gram of said gas, and the speed of forming said thin film is adjusted to at least 10 Å/sec.

19. The process of claim 18 wherein the amount of the enegy is adjusted to 10 to 100 KJ per gram of said gas, and the speed of forming the thin film is adjusted to at least 15 Å/sec.

20. The process of claim 19 further comprising: deleting said film-forming gas with helium, argon, or hydrogen.

21. The process of claim 20 wherein said diluting of said film-forming gas is to a concentration of 5 to 20% by volume.

* * * * *

UNITED STATES PATENT AND TRADEMARK OFFICE
CERTIFICATE OF CORRECTION

PATENT NO. : 4,749,588

DATED : June 7, 1988

INVENTOR(S) : Nobuhiro Fukuda et al.

It is certified that error appears in the above-identified patent and that said Letters Patent is hereby corrected as shown below:

On The Title Page, insert Item [30],

-- [30]  Foreign Application Priority Data
  Jan. 11, 1983  [JP]  Japan.........58-1725
  Jan. 11, 1983  [JP]  Japan.........58-1726
  Jan. 11, 1983  [JP]  Japan.........58-55201  --.

Item [63] should read as follows:

-- [63]  Continuation of Ser. No. 653,246, Sept. 7, 1984, now abandoned, filed as PCT JP84/0001 on Jan. 10, 1984, published as WO84/02804 on July 19, 1984. --.

The sheets of Drawings consisting of Figures 1-5 should be added as per attached sheets.

On the title page, "21 Claims, No Drawings" should read
  -- 21 Claims, 3 Drawing Sheets --.

Signed and Sealed this

Twenty-ninth Day of August, 1989

Attest:

DONALD J. QUIGG

Attesting Officer

Commissioner of Patents and Trademarks

AREA = 0.037 [cm²]
Voc = 0.78 [V]
isc = 12.9 [mA/cm²]
FF = 0.562
EFF = 5.69 [%]